United States Patent [19]
Sanborn et al.

[11] Patent Number: 5,221,399
[45] Date of Patent: Jun. 22, 1993

[54] JOINING OF PRINTED WIRING BOARD TO ALUMINUM STIFFENER USING ADHESIVE FILM, ELECTRICALLY INSULATIVE MESH STRUCTURE THAT CURES AT ROOM TEMPERATURE

[75] Inventors: James A. Sanborn, Satellite Beach; Janet D. Sadlon, Melbourne; Talmadge H. Callahan, Satellite Beach; Decosta R. Alewine, Palm Bay; Gary Rief, Melbourne; Greg Jandzio, Palm Bay, all of Fla.

[73] Assignee: Harris Corporation, Melbourne, Fla.

[21] Appl. No.: 665,262

[22] Filed: Mar. 5, 1991

[51] Int. Cl.⁵ ............................................. B29C 65/00
[52] U.S. Cl. ................................... 156/285; 156/253; 156/313; 165/185; 428/247
[58] Field of Search ................ 428/247; 156/253, 313, 156/285; 165/185

[56] References Cited

U.S. PATENT DOCUMENTS

| 2,909,204 | 10/1959 | Somerville | 156/313 |
| 4,685,987 | 8/1987 | Fick | 165/185 |

FOREIGN PATENT DOCUMENTS

| 1418483 | 12/1975 | United Kingdom | 156/285 |

Primary Examiner—John J. Gallagher
Attorney, Agent, or Firm—Evenson, Wands, Edwards, Lenahan & McKeown

[57] ABSTRACT

Materials having diverse coefficients of thermal expansion are joined together by means of an adhesive film, electrically insulative mesh structure that cures at room temperature. An adhesive film bonding technique is employed to mount a printed wiring board, having a relatively low coefficient of thermal expansion, to a thermally and electrically conductive aluminum stiffener having a relatively high coefficient of thermal expansion, while maintaining the printed wiring board electrically insulated from the aluminum stiffener. A non-adhesive plastic 'release' film is initially attached to a flat support substrate. A layer of electrically insulative mesh (glass cloth) is taped onto the plastic release film. The glass cloth is then impregnated with an electrically insulative adhesive that cures at room temperature. The aluminum stiffener is then placed on the adhesive-impregnated cloth layer, which is then cut to fit, using the aluminum stiffener as a template. The release polyester film and the flat support substrate are removed, exposing the opposite side of the adhesive-impregnated cloth layer for attachment to the printed wiring board. The resulting laminate assembly of the printed wiring board, the adhesive-impregnated glass cloth, and the aluminum stiffener plate is placed in a vacuum bag and allowed to cure at room temperature. Because the laminate cures at room temperature, the physical configuration of the assembly will not have changed at cure.

15 Claims, 2 Drawing Sheets

JOINING OF PRINTED WIRING BOARD TO ALUMINUM STIFFENER USING ADHESIVE FILM, ELECTRICALLY INSULATIVE MESH STRUCTURE THAT CURES AT ROOM TEMPERATURE

The present invention was developed under a contract with United States Air Force, Contract No. F33657-89-C-5101. The U.S. Government has certain rights in this invention.

FIELD OF THE INVENTION

The present invention relates in general to the assembly of materials having substantially different coefficients of thermal expansion, such as a printed wiring board and an underlying support substrate (e.g. aluminum stiffener member), and is particularly directed to a scheme for intimately joining a printed wiring board to a metallic (e.g. aluminum) stiffener without a thermally induced (adhesive cure-based) warp of the assembly, while maintaining electrical isolation between the printed wiring board and the aluminum stiffener.

BACKGROUND OF THE INVENTION

Electronic circuit assemblies customarily employed for implementing telecommunication systems may comprise one or more printed wiring boards, upon which circuit components are mounted and interconnected, and an underlying electrically and thermally conductive support member, such as an aluminum plate, which serves as both a heat sink and a printed wiring board stiffener. Attachment of a printed wiring board to such a metallic plate is customarily accomplished by means of an adhesive that is both thermally conductive (for providing a heat removal path from the circuit components to the heat sink plate) and is an effective dielectric (for ensuring electrical isolation between the printed wiring board and the aluminum plate and preventing unwanted shorting of the circuit components).

Unfortunately, conventional adhesives that satisfy both of these requirements require an elevated curing temperature (on the order of 250 to 400 degrees F.). Because of the substantial mismatch between the respective coefficients of thermal expansion of the printed wiring board material and the aluminum stiffener, the intended (usually planar) configuration of the printed wiring board, aluminum stiffener laminate structure becomes distorted (warped) upon returning to room temperature. In addition, regardless of whatever cure temperature is required, it is absolutely essential that there be no flow of the adhesive into critical regions of the printed wiring board.

SUMMARY OF THE INVENTION

In accordance with the present invention, the above discussed thermal curing problems of conventionally employed adhesives are obviated by a technique for joining materials having diverse coefficient of thermal expansion using an adhesive film (electrically insulative) mesh structure that cures at room temperature. In particular the invention is directed to a scheme for mounting a printed wiring board, having a first, relatively low, coefficient of thermal expansion, to a thermally and electrically conductive (e.g. aluminum) stiffener member, having a second, relatively high coefficient of thermal expansion, while maintaining the printed wiring board electrically insulated from the aluminum stiffener.

Pursuant to the invention, a non-adhesive plastic 'release' film, such thin sheet of polyester film, which serves as a temporary non-attachment buffer layer, is initially attached (e.g. taped down onto) a flat support substrate, such as an aluminum plate. A layer of electrically insulative mesh or multistrand material, such as glass cloth, is then taped down onto the non-adhesive plastic release film. The weave and thickness of the mesh material are selected to fit the application.

This glass cloth is then impregnated with an electrically insulative adhesive that cures at room temperature. This is preferably accomplished by screeding a dielectric epoxy adhesive into the weave of the cloth, so that the voids between the strands of the cloth are effectively filled or saturated with the epoxy adhesive. Because of the screeding, no excess adhesive remains on the top surface of the impregnated glass cloth layer. With the aluminum stiffener then placed, bonding side down, onto the adhesive-impregnated cloth layer, the cloth is then cut to fit, using the aluminum stiffener as a template.

The release polyester film and the flat support substrate are removed, thereby exposing the opposite side of the adhesive-impregnated cloth layer for attachment to the printed wiring board. The bonding surface of the printed wiring board is then mated to the exposed side of the impregnated cloth layer, resulting in a laminate assembly of the printed wiring board, the adhesive-impregnated glass cloth, and the aluminum stiffener plate. The laminate assembly is placed in a vacuum bag and a vacuum is drawn sufficient to impart a prescribed pressure to the bond line of the assembly. This vacuum-bagged assembly is then allowed to cure at room temperature (e.g. for approximately sixteen hours).

Because of the glass cloth, the adhesive material is effectively constrained from flowing in the presence of the vacuum-induced laminate pressure. Since the resulting adhesive layer (glass cloth plus dielectric epoxy adhesive) has a well defined thickness across the entire bonding surface of the aluminum stiffener, electrical isolation over the entirety of the corresponding mating surface of the printing wiring board is ensured. Moreover, and of particular significance, is the fact that the laminate cures at room temperature, so that when the cure is complete, the physical configuration of the assembly will not have changed.

DETAILED DESCRIPTION

Referring now to FIGS. 1-7, respective steps of the assembly of a printed wiring board, aluminum stiffener laminate structure in accordance with a preferred embodiment of the present invention will be described. While the following description details the steps for the assembly of a printed wiring board to an aluminum stiffener plate, it should be observed that the invention is not limited to only this application, but is applicable to processes for joining essentially any materials having substantially diverse coefficients of thermal expansion, where an elevated curing temperature, that would otherwise subject the assembly to thermally induced physical distortion, cannot be used.

Figure 1:
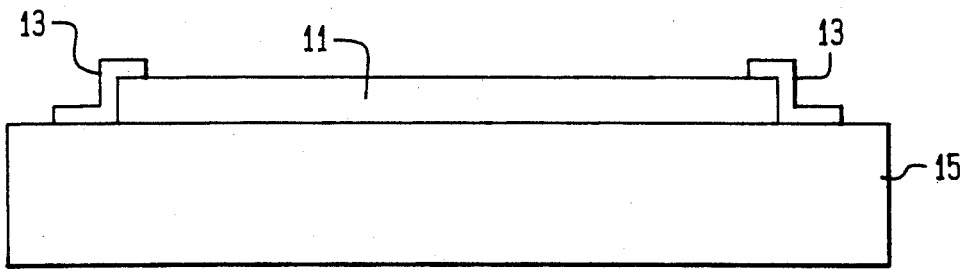
FIGS. 1-7 illustrate a printed wiring board, aluminum stiffener laminate structure at respective stages of its assembly in accordance with the process of the present invention.
Figure 2:
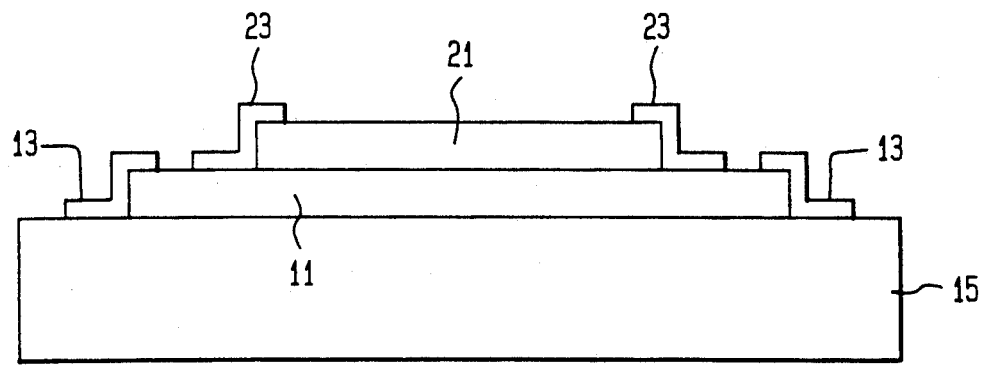

Initially, as shown in FIG. 1, a non-adhesive plastic 'release' film, such as thin sheet of polyester film 11, commonly used in dry adhesive laminating processes, and which serves as a temporary non-attachment buffer layer, is attached, for example, taped down along its edges 13, onto a flat support substrate, such as an aluminum plate 15. Next, as shown in FIG. 2, a layer of electrically insulative mesh material, such as a single layer of glass cloth 21 (e.g. 120 weave, four mils thickness) is similarly taped down along its edges 23 onto the non-adhesive plastic release film 11. It should be observed that the weave and thickness parameters given here are simply exemplary values, which may vary depending upon the application. In the case of the application of the invention to a printed wiring board, aluminum stiffener assembly, it is important that the thickness of the cloth be sufficient to ensure complete dielectric isolation in the presence of a subsequently applied vacuum-induced laminate pressure. Since the resulting adhesive layer (glass cloth plus impregnated dielectric epoxy adhesive) has a well defined thickness across the entire bonding surface of the aluminum stiffener, electrical isolation over the entirety of the corresponding mating surface of the printing wiring board is ensured.

Figure 3:
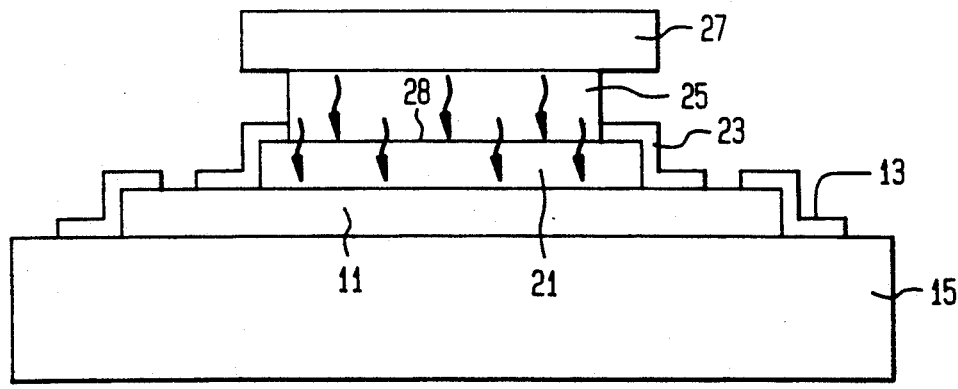

As shown in FIG. 3, glass-cloth 21 is then impregnated with an electrically insulative adhesive material 25 that cures at room temperature. Such a material may comprise a commercially available dielectric epoxy material, such as Hysol EA9394 epoxy adhesive mixed as 100 parts by weight of part A to 17 parts by weight of part B. The epoxy mix 25 is impregnated into the glass cloth 21 by using a straight edge 27 to screed it into the weave of the cloth, so that the voids between the strands of the cloth are effectively filled or saturated with the epoxy adhesive. As noted earlier because of the provision of the glass cloth 21, adhesive material 25 is effectively constrained from flowing in the presence of the vacuum-induced laminate pressure. In addition, due to the screeding step, this adhesive impregnated glass layer 26 (glass cloth 21 plus dielectric epoxy adhesive 25) has a well defined thickness across its entire bonding surface, with no excess adhesive material remaining on its top surface 28.

Figure 4:
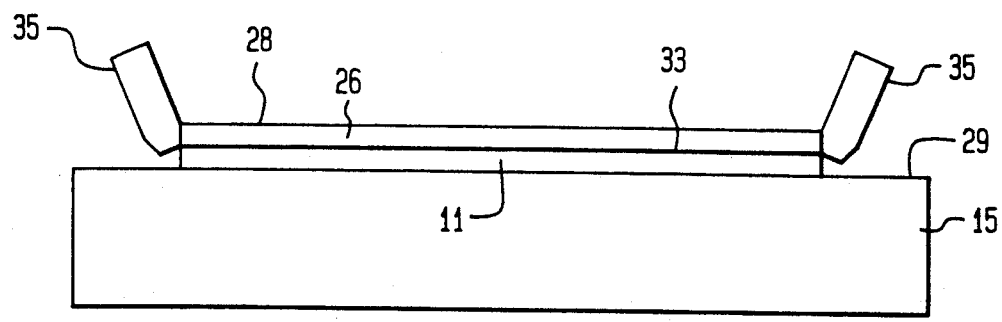

Following the impregnation step, an aluminum stiffener 31 is then placed, bonding side 33 down, as shown in FIG. 4, onto the top surface 28 of adhesive-impregnated cloth layer 25. Using aluminum stiffener 31 as a template, impregnated cloth layer 25 is then cut (using a razor blade) along lines 33, so as to conform with the bonding perimeter of aluminum stiffener 31.

Figure 5:
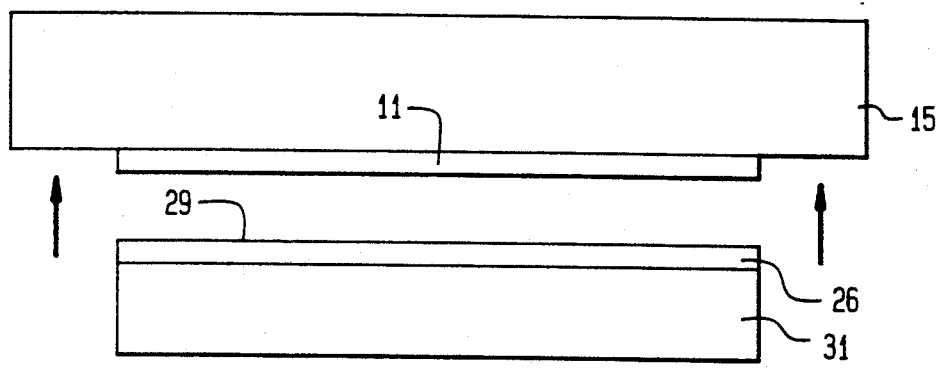
Figure 6:
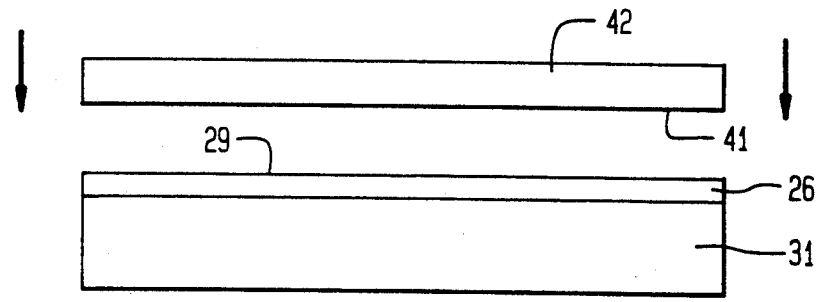

Next, as shown in FIG. 5, polyester film 11 and the flat aluminum plate 15 are removed, thereby exposing the opposite surface 29 of adhesive-impregnated cloth layer 25 for attachment to the printed wiring board. As shown in FIG. 6, the bonding surface 41 of the printed wiring board 42 is then mated to the exposed surface 29 of impregnated cloth layer 26, resulting in a laminate assembly of printed wiring board 42, adhesive-impregnated glass cloth layer 26 and the aluminum stiffener 31.

Figure 7:
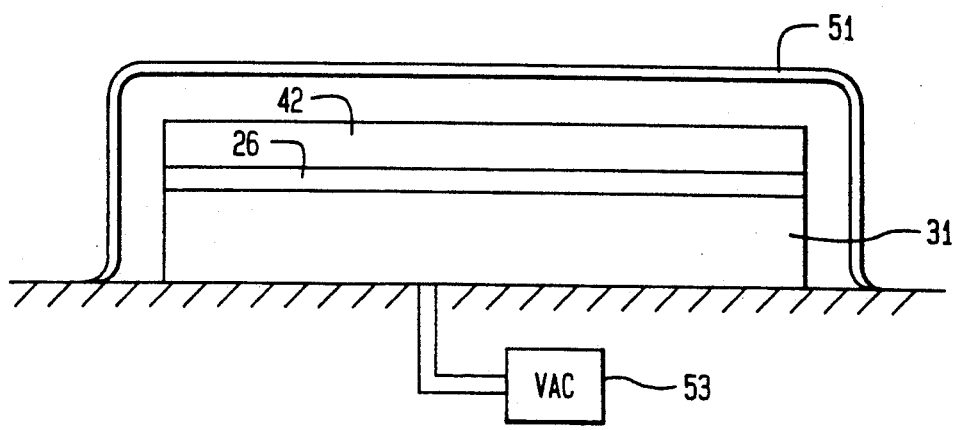

The laminate assembly is placed in a vacuum bag 51 and a vacuum is drawn by way of an attached vacuum unit 53, as shown in FIG. 7. The degree of vacuum is sufficient to impart a prescribed pressure (e.g. 14.5 psi) to the bond line of the assembly. This vacuum-bagged assembly is then allowed to cure at room temperature (e.g. for approximately sixteen hours). As pointed out above, because laminate adhesive layer 26 cures at room temperature, the physical configuration of the assembly will not have changed once the cure is complete. This important aspect of the process of the present invention is in sharp contrast to conventional processes which employ film adhesives that require an elevated temperature that inherently causes physical distortion (warping) of the laminate structure upon returning to room temperature.

As will be appreciated from the foregoing description, the thermal problems of conventionally employed adhesives are obviated by the bonding technique according to the present invention which is capable of joining materials having diverse coefficients of thermal expansion using an adhesive film (electrically insulative) mesh structure that cures at room temperature. The invention is particularly useful for mounting a printed wiring board, which typically has a relatively low coefficient of thermal expansion, to a thermally and electrically conductive aluminum stiffener member, having a much higher coefficient of thermal expansion, while maintaining the printed wiring board electrically insulated from the aluminum stiffener. As the glass cloth is effective in capturing and confining the adhesive material between the printed wiring board and the aluminum stiffener, the epoxy adhesive is effectively constrained from flowing in the presence of the vacuum-induced laminate pressure.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed is:

1. A process for mounting a circuit board, having a first coefficient of thermal expansion, to a thermally and electrically conductive structural support, having a second coefficient of thermal expansion different from said first coefficient of thermal expansion, while maintaining said circuit board electrically insulated from said structural support, comprising the steps of:
   (a) impregnating a layer of electrically insulative mesh material with an electrically insulative adhesive that cures at room temperature;
   (b) forming a laminate assembly of said circuit board, said layer of electrically insulative mesh material impregnated in step (a) and said structural support, such that said layer of adhesive-impregnated electrically insulative mesh material is interposed between said circuit board and said structural support; and
   (c) allowing said laminate assembly to cure at room temperature.

2. A process according to claim 1, wherein step (a) comprises impregnating a layer of electrically insulative glass fabric with an electrically insulative epoxy adhesive that will not migrate under pressure and cures at room temperature, so as to effectively fill all voids among strands of the insulative glass fabric without excess adhesive overfilling of said fabric.

3. A process according to claim 2, wherein step (b) further includes the step of drawing a vacuum on said laminate assembly of said circuit board, said layer of electrically insulative mesh material impregnated in step (a) and said thermally conductive support.

4. A process for mounting a printed wiring board, having a first coefficient of thermal expansion, to a thermally and electrically conductive support, having a second coefficient of thermal expansion different from that of said first coefficient of thermal expansion, while maintaining said circuit board electrically insulated from said support, comprising the steps of:

(a) attaching a non-adhesive film to a substrate;

(b) attaching a layer of electrically insulative mesh material to said non-adhesive film;

(c) impregnating said layer of electrically insulative mesh material with an electrically insulative adhesive that cures at room temperature;

(d) attaching said support to the adhesive-impregnated layer of electrically insulative mesh material;

(e) removing said non-adhesive film and thereby said substrate from said layer of adhesive-impregnated electrically insulative mesh material;

(f) mating said circuit board to that side of said mesh material from which said non-adhesive film and said substrate have been removed in step (e), so as to form a laminate assembly of said circuit board, said layer of adhesive-impregnated electrically insulative mesh material and said support, such that said layer of adhesive-impregnated electrically insulative mesh material is interposed and provides a layer of electrical insulation between said circuit board and said support; and (g) allowing said laminate assembly to cure at room temperature.

5. A process according to claim 4, wherein step (c) comprises impregnating a layer of electrically insulative glass fabric with an electrically insulative epoxy adhesive that will not migrate under pressure and cures at room temperature, so as to effectively fill all voids among strands of the insulative glass fabric without excess adhesive overfilling of said fabric.

6. A process according to claim 5, wherein step (c) comprises screeding said electrically insulative adhesive into said glass fabric so as to thoroughly fill all voids among strands of the insulative glass fabric without excess adhesive overfilling of said fabric.

7. A process according to claim 5, wherein step (f) further includes the step of drawing a vacuum on said laminate assembly of said circuit board, said layer of electrically insulative mesh material impregnated in step (c) and said support.

8. A process for attaching a first substrate, having a first coefficient of thermal expansion, to a second substrate, having a second coefficient of thermal expansion different from said first coefficient of thermal expansion, comprising the steps of:

(a) impregnating a layer of mesh material with an adhesive that cures at room temperature;

(b) forming a laminate assembly of said first substrate, said layer of mesh material impregnated in step (a) and said second substrate, such that said layer of adhesive-impregnated mesh material is interposed between said first substrate and said second substrate; and (c) allowing the laminate assembly formed in step (c) to cure at room temperature.

9. A process according to claim 8, wherein said first substrate comprises a printed wiring board, said second substrate comprises an electrically and thermally conductive structural support, said layer of mesh material is a layer of electrically insulative mesh material, and said adhesive is an electrically insulative adhesive that cures at room temperature.

10. A process according to claim 8, wherein step (a) comprises impregnating said layer of mesh material with an epoxy adhesive that will not migrate under pressure and cures at room temperature, so as to effectively fill all voids among strands of said layer of mesh material without excess adhesive overfill.

11. A process according to claim 8, wherein step (a) comprises screeding said adhesive into said mesh material so as to thoroughly fill all voids among strands of the mesh material without excess adhesive overfilling of said mesh material.

12. A process according to claim 8, wherein step (b) further includes the step of drawing a vacuum on said laminate assembly.

13. A process for mounting a first substrate, having a first coefficient of thermal expansion, to a second substrate, having a second coefficient of thermal expansion different from that of said first coefficient of thermal expansion, while maintaining said first substrate spaced apart from said first substrate, comprising the steps of:

(a) attaching a non-adhesive, release film to a support member;

(b) attaching a layer of mesh material to said non-adhesive film;

(c) impregnating said layer of mesh material with an adhesive that cures at room temperature;

(d) attaching said first substrate to the adhesive-impregnated layer of mesh material;

(e) removing said non-adhesive film and thereby said support member from said layer of adhesive-impregnated mesh material;

(f) mating said second substrate to that side of said mesh material from which said non-adhesive film and said support member have been removed in step (e), so as to form a laminate assembly of said first substrate, said layer of adhesive-impregnated mesh material and said second substrate, such that said layer of adhesive-impregnated mesh material is interposed between and physically separates said first substrate and said second substrate; and (g) allowing said laminate assembly to cure at room temperature.

14. A process according to claim 13, wherein step (c) comprises impregnating a layer of multistrand fabric with an epoxy adhesive that will not migrate under pressure and cures at room temperature, so as to effectively fill all voids among strands of said fabric without excess adhesive overfilling of said fabric.

15. A process according to claim 13, wherein step (f) further includes the step of drawing a vacuum on said laminate assembly.

* * * * *